(12) United States Patent
Yoshida et al.

(10) Patent No.: US 9,534,976 B2
(45) Date of Patent: Jan. 3, 2017

(54) PRESSURE SENSOR FOR VEHICLE IN THE EVENT OF A COLLISION

(71) Applicant: DENSO CORPORATION, Kariya, Aichi-pref. (JP)

(72) Inventors: Masatada Yoshida, Ichinomiya (JP); Makoto Sakai, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 12 days.

(21) Appl. No.: 14/556,494

(22) Filed: Dec. 1, 2014

(65) Prior Publication Data
US 2015/0153241 A1    Jun. 4, 2015

(30) Foreign Application Priority Data
Dec. 3, 2013  (JP) ................................. 2013-250038

(51) Int. Cl.
| | |
|---|---|
| G01M 7/00 | (2006.01) |
| G01N 3/30 | (2006.01) |
| G01N 3/32 | (2006.01) |
| G01N 3/00 | (2006.01) |
| G01L 7/08 | (2006.01) |
| H01G 7/00 | (2006.01) |

(Continued)

(52) U.S. Cl.
CPC .......... *G01L 19/147* (2013.01); *G01L 9/0051* (2013.01)

(58) Field of Classification Search
None
See application file for complete search history.

(56) References Cited

U.S. PATENT DOCUMENTS

| | | | | |
|---|---|---|---|---|
| 7,124,638 | B2 * | 10/2006 | Kandler | .............. B60C 23/0408 73/708 |
| 7,426,868 | B2 * | 9/2008 | Fessele | ................. G01L 19/069 73/706 |

(Continued)

FOREIGN PATENT DOCUMENTS

| | | |
|---|---|---|
| JP | 4-204226 | 7/1992 |
| JP | 2001-153746 | 6/2001 |

(Continued)

OTHER PUBLICATIONS

Office Action dated Oct. 1, 2015 in corresponding Japanese Application No. 2013-250038.

*Primary Examiner* — Peter Macchiarolo
*Assistant Examiner* — Jermaine Jenkins
(74) *Attorney, Agent, or Firm* — Harness, Dickey & Pierce, P.L.C.

(57) ABSTRACT

A pressure sensor includes a sensor housing mounted on a vehicle, a first detector located in the housing and having a first diaphragm facing a sealed space of the vehicle, a second detector located in the housing and having a second diaphragm facing the sealed space, and a protector located in the housing and covering the first and second detectors. A first chamber is formed between the first diaphragm and the housing and isolated from the sealed space so that the first diaphragm can be deformed by a pressure in the sealed space. A second chamber is formed between the second diaphragm and the sensor housing and communicates with the sealed space. The first and second diaphragms produce the same signal when being deformed by the same amount in the same direction.

9 Claims, 6 Drawing Sheets

(51) Int. Cl.
*G01L 19/14* (2006.01)
*G01L 9/00* (2006.01)

(56) References Cited

U.S. PATENT DOCUMENTS

| | | | | |
|---|---|---|---|---|
| 7,556,119 B2 * | 7/2009 | Takehara | ............ | B60R 21/0136 |
| | | | | 180/274 |
| 7,845,677 B2 * | 12/2010 | Franke | ................ | B60R 21/0136 |
| | | | | 280/735 |
| 8,006,797 B2 * | 8/2011 | Aoyama | ............ | B60R 21/0136 |
| | | | | 180/274 |
| 8,230,743 B2 * | 7/2012 | Wade | .................... | G01L 9/0052 |
| | | | | 73/706 |
| 8,276,455 B2 * | 10/2012 | Watanabe | ............ | G01L 19/141 |
| | | | | 73/700 |
| 8,931,348 B2 * | 1/2015 | Kunert | ................ | B60R 21/0136 |
| | | | | 73/714 |
| 2001/0028072 A1 | 10/2001 | Aoki et al. | | |
| 2007/0051599 A1 | 3/2007 | Takehara et al. | | |

FOREIGN PATENT DOCUMENTS

| | | |
|---|---|---|
| JP | 2007-071596 | 3/2007 |
| JP | 2009-244066 | 10/2009 |

\* cited by examiner

PRESSURE SENSOR FOR VEHICLE IN THE EVENT OF A COLLISION

CROSS REFERENCE TO RELATED APPLICATION

This application is based on and claims priority to Japanese Patent Application No. 2013-250038 filed on Dec. 3, 2013, the contents of which are incorporated herein by reference.

FIELD

The present disclosure relates to a pressure sensor mounted on a vehicle and configured to detect pressure occurring in the vehicle.

BACKGROUND

As disclosed in, for example, JP-A-2007-71596 corresponding to US 2007/0051599A1, a collision detector for detecting a collision to the side of a vehicle is known. In the conventional collision detector, a pressure sensor is installed inside a side door of the vehicle, and the collision is detected based on a change in pressure in the side door caused by deformation of the side door in the event of the collision. When the collision is detected, a side airbag or the like is activated so that an occupant can be protected from impact of the collision.

In the event of a collision to a side door of a vehicle, it is likely that a pressure increase in the side door due to deformation of the side door occurs at the same time as vibration of the side door due to not only the collision impact but also a movement of the vehicle. Accordingly, the pressure increase and the vibration are superimposed on each other and applied to a pressure sensor inside the side door. As a result, a detection value of the pressure sensor is derived from not only the pressure increase but also the vibration. For this reason, it is difficult to accurately detect the pressure change only inside the side door.

To avoid this disadvantage, the conventional collision detector disclosed in JP-A-2007-71596 uses a vibration sensor in addition to the pressure sensor. A diaphragm of the pressure sensor is exposed to sealed space inside the side door, but a diaphragm of the vibration sensor is isolated from the sealed space. A detection value of the vibration sensor is subtracted from a detection value of the pressure sensor so that an influence of the vibration of the side door on the detection value of the pressure sensor can be removed. In the conventional collision detector disclosed in JP-A-2007-71596, although the diaphragm of the pressure sensor is covered with a protector made of synthetic resin, the diaphragm of the vibration sensor is not covered with such a protector. Therefore, an influence of vibration of the protector on the detection value of the pressure sensor cannot be removed. In particular, in recent years, a protector for protecting inner electronic devices of a pressure sensor has become essential, and the demand for highly accurate collision detection performance has been increased. For these reasons, an influence of vibration of a protector on a detection value of a pressure sensor becomes concern.

SUMMARY

In view of the above, it is an object of the present disclosure is to provide a pressure sensor mountable on a vehicle and configured to accurately detect a change in pressure occurring in the vehicle.

According to an aspect of the present disclosure, a pressure sensor for a vehicle includes a sensor housing adapted to be mounted on the vehicle, a first detector located in the sensor housing and having a first diaphragm facing a sealed space of the vehicle, a second detector located in the sensor housing and having a second diaphragm facing the sealed space, and a protector located in the sensor housing and covering the first detector and the second detector. A first chamber is formed between the first diaphragm and the sensor housing and isolated from the sealed space so that the first diaphragm is capable of being deformed by a pressure in the sealed space. A second chamber is formed between the second diaphragm and the sensor housing and communicates with the sealed space. The first diaphragm and the second diaphragm produce the same signal when being deformed by the same amount in the same direction.

According to this aspect, in the event of a collation of the vehicle, a detection signal of the first diaphragm is derived from not only the pressure in the sealed space but also impact vibration of the first diaphragm and a portion of the protector covering the first diaphragm, but a detection signal of the second diaphragm is derived from only impact vibration of the second diaphragm and a portion of the protector covering the second diaphragm. By subtracting the detection signal of the second diaphragm from the detection signal of the first diaphragm, an influence of the impact vibration on the detection signal of the first diaphragm is removed. Thus, a change in the pressure in the sealed space can be accurately detected.

In particular, both the first diaphragm and the second diaphragm are covered with the protector. Therefore, the above subtraction can remove not only the influence of the impact vibration of the first diaphragm on the detection signal of the first diaphragm but also the influence of the impact vibration of the protector on the detection signal of the first diaphragm. Accordingly, the change in the pressure in the sealed space can be detected more accurately.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Embodiments of the present disclosure are described below with reference to the drawings. Throughout the embodiments, like characters of reference indicate the same or equivalent parts.

(First Embodiment)

Figure 1:
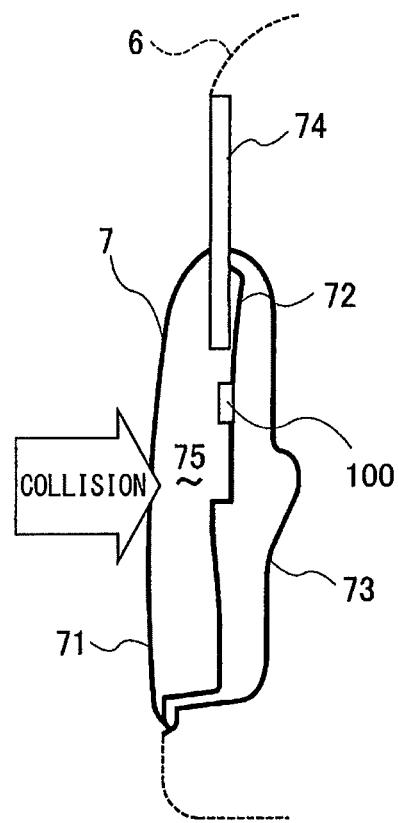
FIG. 1 is a diagram illustrating a cross-sectional view of a vehicle door where a pressure sensor structure according to a first embodiment of the present disclosure.

An airbag system including a pressure sensor structure 100 according to a first embodiment of the present disclosure is described below with reference to FIGS. 1-6. As shown in FIG. 1, a side door 7 of a vehicle 6 has an outer panel 71 and an inner panel 72. The outer panel 71 defines a side surface of the vehicle 6. The inner panel 72 faces the outer panel 71 and located is closer to a cabin of the vehicle 6 than the outer panel 71. The outer panel 71 and the inner panel 72 are formed by press-molding of a steel plate. The respective outer edges of the outer panel 71 and the inner panel 72 are welded so that the outer panel 71 and the inner panel 72 can be integrated. A door trim 73 made of synthetic resin or the like is attached to the inner panel 72 on the cabin side.

A windowpane 74 projects from a top edge of the door 7. The windowpane 74 is capable of moving up and down between the outer panel 71 and the inner panel 72. The door 7 has an inner sealed room 75 defined by the outer panel 71, the inner panel 72, and the windowpane 74. The sealed room 75 corresponds to sealed space recited in claims. It is not always essential that the sealed room 75 is completely sealed against external high pressure. What is needed is that the sealed room 75 is sealed by a sealing force which can prevent rain from entering the sealed room 75. For example, the sealing room 75 may communicate with the environment outside the door 7 through a water drain hole formed in the bottom of the door 7.

The pressure sensor structure 100 is fixed to the inner panel 72. The pressure sensor structure 100 is exposed to the sealed room 75 so as to detect an increase (i.e., change) in pressure in the sealed room 75 when the sealed room 75 is compressed by deformation of the door 7 in the event of a collision.

Figure 2:
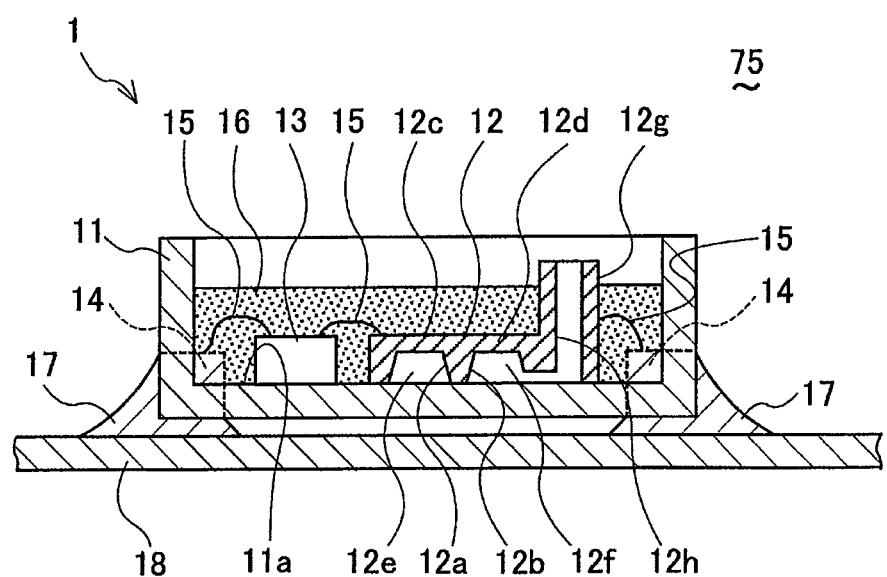
FIG. 2 is a diagram illustrating a cross-sectional view of a pressure sensor included in the pressure sensor structure shown in FIG. 1.

A pressure sensor 1 shown in FIG. 2 is incorporated in the pressure sensor structure 100. The pressure sensor 1 is a semiconductor pressure sensor. The pressure sensor 1 includes a sensor housing 11 made of synthetic resin or the like and a sensor body 12 held in the sensor housing 11. The sensor body 12 corresponds to a combination of a first detector and a second detector recited in claims. The sensor body 12 is implemented on a silicon chip and located facing the sealed room 75 across a protector 16. A lower surface of the sensor body 12 is provided with a first recess 12a and a second recess 12b. A first diaphragm 12c and a second diaphragm 12d are formed on bottoms (tops in FIG. 2) of the first recess 12a and the second recess 12b, respectively. The first diaphragm 12c and the second diaphragm 12d are capable of being deformed in the same direction.

When the sensor body 12 is mounted on a bottom 11a of the sensor housing 11, a first chamber 12e filled with air is formed between the sensor housing 11 and the first diaphragm 12c, and a second chamber 12f filled with air is formed between the sensor housing 11 and the second diaphragm 12d. As can be seen from FIG. 2, the first chamber 12e is isolated from the second chamber 12f. That is, the first chamber 12e does not communicate with the second chamber 12f.

The sensor body 12 has an integral extension portion 12g extending (upward in FIG. 2) to reach the sealed room 75 by penetrating the protector 16. The extension portion 12g has a through hole 12h extending through it and communicating with the sealed room 75 and the second chamber 12f. Thus, the second chamber 12f communicates with the sealed room 75 via the through hole 12h. As mentioned above, since the first chamber 12e is isolated from the second chamber 12f, the first chamber 12e is isolated from the sealed room 75.

A circuit chip 13 made from a silicon chip is mounted on the bottom 11a of the sensor housing 11 and arranged in a lateral direction with respect to the sensor body 12. Electrodes 14 are provided on corners inside the sensor housing 11. Bonding wires 15 connect the electrodes 14 to the sensor body 12, connect the electrodes 14 to the circuit chip 13, and connect the sensor body 12 to the circuit chip 13. The protector 16 is placed in the sensor housing 11 so that the sensor body 12, the circuit chip 13, the electrodes 14, and the bonding wires 15 can be covered with the protector 16. The protector 16 is made of fluoride gel, which is a type of fluorine resin.

The electrodes 14 are electrically connected to a sensor board 18 through solders 17. The sensor board 18 is fixed to the inner panel 72 through a container in which the pressure sensor structure 100 is held. Thus, the sensor housing 11 is fixed to the door 7 through the sensor board 18.

Figure 3:
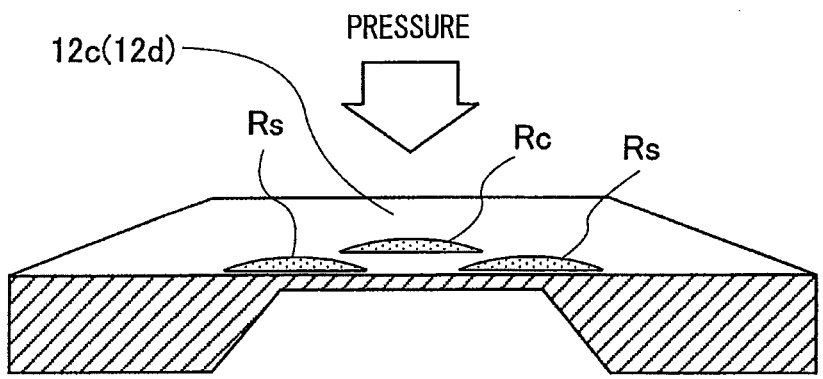
FIG. 3 is a diagram illustrating a cross-sectional view of a diaphragm of the pressure sensor.

As shown in FIG. 3, each of the first diaphragm 12c and the second diaphragm 12d of the pressure sensor 1 is formed by thinning a silicon chip. Two, diffused resistors Rc and two diffused resistors Rs are integrally formed on each of the first diaphragm 12c and the second diaphragm 12d. It is noted that FIG. 3 shows one of the two diffused resistors Rc. Each of the diffused resistors Rc and Rs is integral with the first diaphragm 12c and the second diaphragm 12d. When the first diaphragm 12c is deformed downward in FIG. 3 by pressure occurring in the sealed room 75, resistances of the diffused resistors Rc and Rs increase and decrease. Further, when the door 7 vibrates due to the collision impact or a movement of the vehicle 6, the first diaphragm 12c and the second diaphragm 12d are deformed upward or downward in FIG. 3, and resistances of the diffused resistors Rc and Rs increase and decrease.

Figure 4:
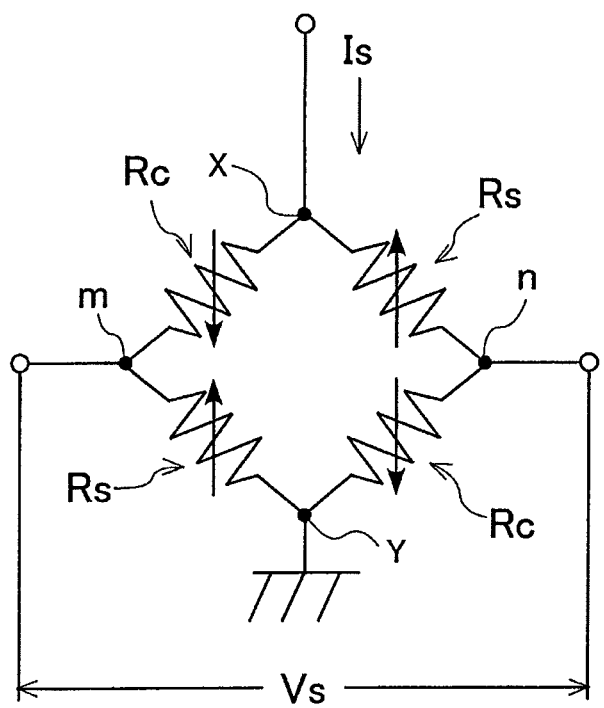
FIG. 4 is a diagram illustrating a pressure detection circuit constructed with resistors on the diaphragm.

As shown in FIG. 4, the diffused resistors Rc and Rs are connected in a Wheatstone bridge on each of the first diaphragm 12c and the second diaphragm 12d. The pressure occurring in the sealed room 75 can be detected by detecting a voltage Vs between a node n and a node m while passing electric current Is from a point X to a point Y for reasons described below.

In a first case where the Wheatstone bridge formed with the diffused resistors Rc and Rs is balanced, the nodes m and n have the same potential, so the voltage Vs between the nodes n and m is zero.

In a second case where the first diaphragm 12c is deformed downward in FIG. 3 due to a change in the pressure in the sealed room 75, the resistances of the diffused resistors Rc decrease, but the resistances of the diffused resistors Rs. increase. Accordingly, the potential of the node m becomes higher than the potential of the node n, so that the voltage Vs between the nodes m and n has a value depending on the amount of the deformation of the first diaphragm 12c.

In a third case where each of the first diaphragm 12c and the second diaphragm 12d is deformed upward in FIG. 3 due to the impact vibration applied to the door 7, the resistances of the diffused resistors Rc increase, but the resistances of the diffused resistors Rs decrease. Accordingly, the potential of the node n becomes higher than the potential of the node m, so that the voltage Vs between the nodes m and n has a value depending on the amount of the deformation of each of the first diaphragm 12c and the second diaphragm 12d. The voltage Vs appearing in the third case is opposite in polarity to the voltage Vs appearing in the second case.

In the pressure sensor 1, the first. diaphragm 12c and the second diaphragm 12d have the same characteristics including the thickness of the protector 16 covering the first diaphragm 12c and the second diaphragm 12d. Accordingly, when the impact vibration applied to the first diaphragm 12c has the same magnitude and direction as the impact vibration applied to the second diaphragm 12d, the voltage Vs generated by the first diaphragm 12c has the same magnitude and polarity as the voltage Vs generated by the second diaphragm 12d. The voltage Vs between the nodes m and n is hereinafter referred to as the "detection value" of the first diaphragm 12c or the second diaphragm 12d.

The pressure sensor 1 is not limited to the structure described above. For example, a strain gauge can be used instead of the diffused resistors Rc and Rs.

Figure 5:
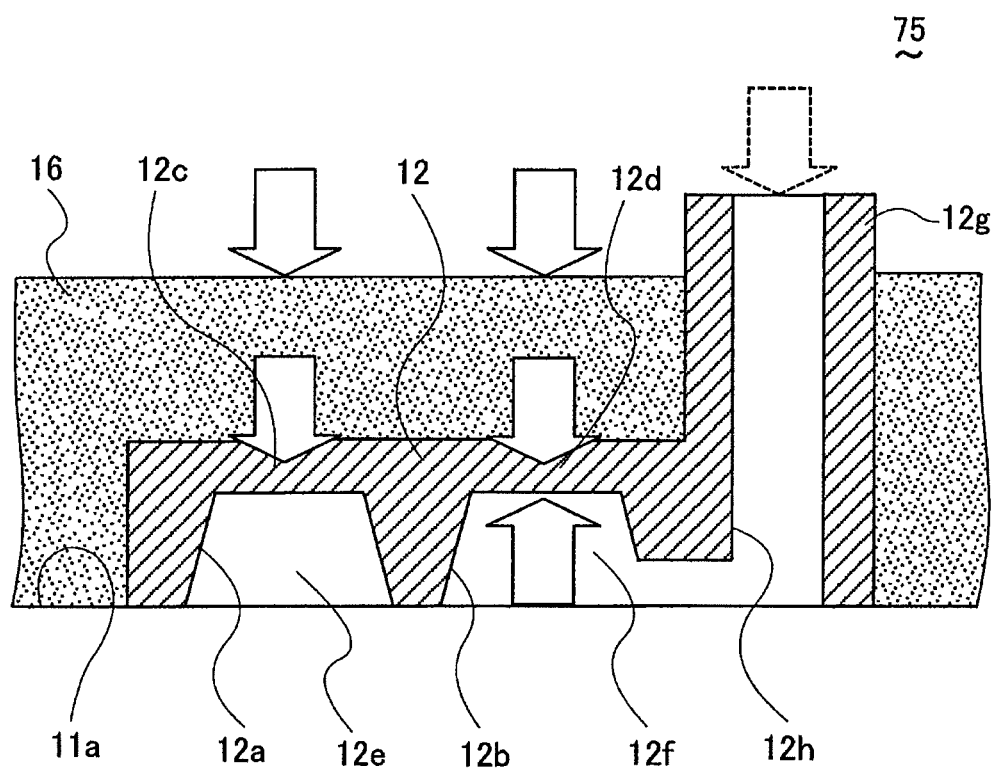
FIG. 5 is a diagram illustrating a cross-sectional view for explaining how the pressure sensor detects pressure.

Next, how the pressure change occurring in the sealed room 75 and the impact vibration applied to the door 7 in the event of a collision to the door 7 act on the pressure sensor 1 is described with reference to FIG. 5.

As mentioned previously, the first chamber 12e of the pressure sensor 1 is isolated from the sealed room 75. Therefore, the pressure change occurring in the sealed room 75 deforms the first diaphragm 12c downward in FIG. 5 through the protector 16.

In contrast, since the second chamber 12f communicates with the sealed room 75 through the through hole 12h, the pressure change occurring in the sealed room 75 is transmitted to the second chamber 12f. Therefore, the second chamber 12f is not deformed even when the pressure change occurs in the sealed room 75.

The impact vibration applied to the door 7 produces acceleration in the first diaphragm 12c and a portion of the protector 16 covering the first diaphragm 12c, and the first diaphragm 12c is deformed upward or downward by the acceleration. Likewise, the impact vibration applied to the door 7 produces acceleration in the second diaphragm 12d and a portion of the protector 16 covering the second diaphragm 12d, and the second diaphragm 12d is deformed upward or downward by the acceleration.

Therefore, in the event of a collision to the door 7, the detection value of the first diaphragm 12c is derived from not only the pressure in the sealed room 75 but also the impact vibration of the first diaphragm 12c and the portion of the protector 16 covering the first diaphragm 12c, but the detection value of the second diaphragm 12d is derived from only the impact vibration of the second diaphragm 12d and the portion of the protector 16 covering the second diaphragm 12d.

Figure 6:
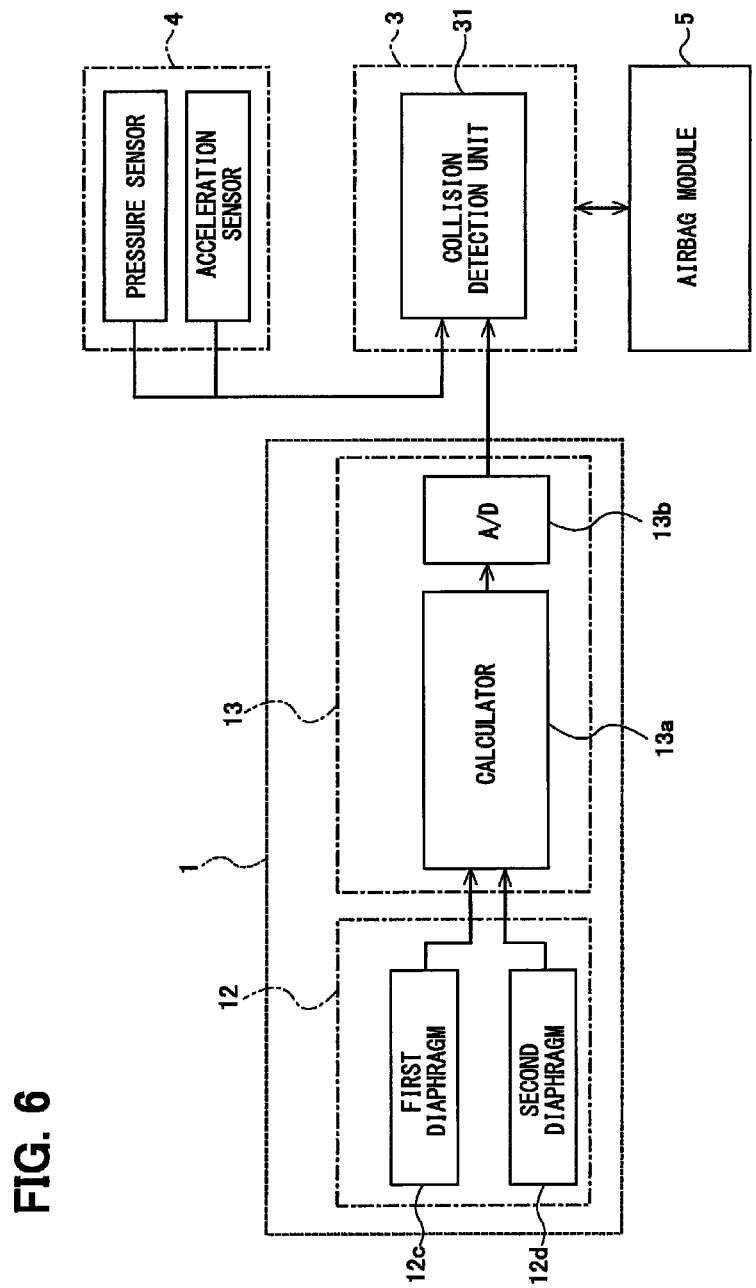
FIG. 6 is a block diagram of an airbag system including the pressure sensor.

Next, the airbag system including the pressure sensor 1 according to the first embodiment and its operation are described with reference to FIG. 6. The circuit chip 13 of the pressure sensor 1 has a calculator 13a and an A/D converter 13b. The calculator 13a subtracts the detection value of the second diaphragm 12d from the detection value of the first diaphragm 12c. The calculator 13a is connected to the A/D converter 13b, and the A/D converter 13b is connected to a collision detection unit 31 of an airbag controller 3. Although not shown in the drawings, the airbag controller 3 includes an input/output (I/O) section, a central processing unit (CPU), and a random access memory (RAM).

The airbag controller 3 is connected to a sensor group 4 including another pressure sensor and an acceleration sensor. Further, the airbag controller 3 is connected to an airbag module 5. Although not shown in the drawings, the airbag module 5 includes an inflator, a squib, and an airbag and operates in a conventional manner.

As mentioned previously, a detection value PS1 of the first diaphragm 12c in the event of a collision to the door 7 is given as follows: PS1=$\Delta$P+$\Delta$F, where $\Delta$P represents the change in the pressure in the sealed room 75, and $\Delta$F represents the impact vibration of the first diaphragm 12c and the portion of the protector 16 covering the first diaphragm 12c.

In contrast, a detection value PS2 of the second diaphragm 12d in the event of a collision to the door 7 is given as follows: PS2=$\Delta$F, where $\Delta$F represents the impact vibration of the second diaphragm 12d and the portion of the protector 16 covering the second diaphragm 12d.

The calculator 13a calculates a pressure PS0 in the sealed room 75 by subtracting the detection value PS2 of the second diaphragm 12d from the detection value PS1 of the first diaphragm 12c. That is, the pressure PS0 is calculated as follows: PS0=PS1−PS2=($\Delta$P+$\Delta$F)−($\Delta$F)=$\Delta$P. The pressure PS0 calculated by the calculator 13a is digitalized by the A/D converter 13b and then sent to the collision detection unit 31 of the airbag controller 3.

The collision detection unit 31 determines that the vehicle 6 collides with something and activates the airbag module 5 when determining that any of the following conditions (i), (ii), and (iii) is met:

(i) The pressure PS0 detected by the pressure sensor 1 exceeds a predetermined value.

(ii) A pressure inside another door of the vehicle 6 detected by the other pressure sensor included in the sensor group 4 increases.

(iii) An acceleration detected by the acceleration sensor included in the sensor group 4 exceeds a predetermined value.

As described above, according to the first embodiment, the pressure sensor 1 includes the sensor housing 11 and the sensor body 12 held in the sensor housing 11. The sensor body 12 has the first diaphragm 12c and the second diaphragm 12d. The first diaphragm 12c and the second diaphragm 12d are capable of being deformed by the same amount in the same direction to output the same signal when the same force applied to them. The first chamber 12e is formed between the first diaphragm 12c and the sensor housing 11. The second chamber 12f is formed between the second diaphragm 12d and the sensor housing 11. The first chamber 12e is isolated from the sealed room 75 so that the first diaphragm 12c can be deformed by the change in the pressure in the sealed room 75. The second chamber 12f communicates with the sealed room 75 so that the second diaphragm 12d cannot be deformed by the change in the pressure in the sealed room 75.

The pressure sensor 1 further includes the protector 16. The protector 16 is placed in the sensor housing 11 so that the sensor body 12 can be covered with the protector 16. The detection value of the first diaphragm 12c is derived from not only the pressure in the sealed room 75 but also the impact vibration of the first diaphragm 12c and the portion of the protector 16 covering the first diaphragm 12c, but the detection value of the second diaphragm 12d is derived from only the impact vibration of the second diaphragm 12d and the portion of the protector 16 covering the second diaphragm 12d. The change in the pressure in the sealed room 75 is calculated by subtracting the detection value of the second diaphragm 12d from the detection value of the first diaphragm 12c. Thus, since an influence of the impact vibration on the detection value of the first diaphragm 12c is removed, the calculation result accurately indicates the change in the pressure in the sealed room 75.

In particular, both the first diaphragm 12c and the second diaphragm 12d are covered with the protector 16. Therefore, the above calculation can remove not only the influence of the impact vibration of the first diaphragm 12c on the detection value of the first diaphragm 12c but also the influence of the impact vibration of the protector 16 on the detection value of the first diaphragm 12c. Accordingly, the change in the pressure in the sealed room 75 can be detected more accurately.

Further, the sensor body 12 has the extension portion 12g extending to reach the sealed room 75 by penetrating the protector 16. The extension portion 12g has the through hole 12h extending through it and communicating with the sealed room 75 and the second chamber 12f. Since the extension portion 12g is integral with the sensor body 12, a process of manufacturing the sensor body 12 and, by extension, the pressure sensor 1 can be simplified.

In addition, the first diaphragm 12c and the second diaphragm 12d are integral with each other, they can be formed at the same time. Thus, the process of manufacturing the sensor body 12 and, by extension, the pressure sensor 1 can be further simplified.

The pressure sensor 1 has the calculator 13a for calculating the pressure change in the sealed room 75 by subtracting the detection value of the second diaphragm 12d from the detection value of the first diaphragm 12c. In such an approach, the amount of calculation done by the airbag controller 3 is reduced, and accordingly the total size of memory spaces in the airbag controller 3 can be reduced.

The sealed room 75 is formed inside the door 7, and the pressure sensor 1 detects an increase in the pressure in the sealed room 75 caused by the deformation or compression of the sealed room 75 in the event of a collision to the door 7. Thus, it is possible to accurately detect the collision to the door 7.

(Second Embodiment)

Figure 7:
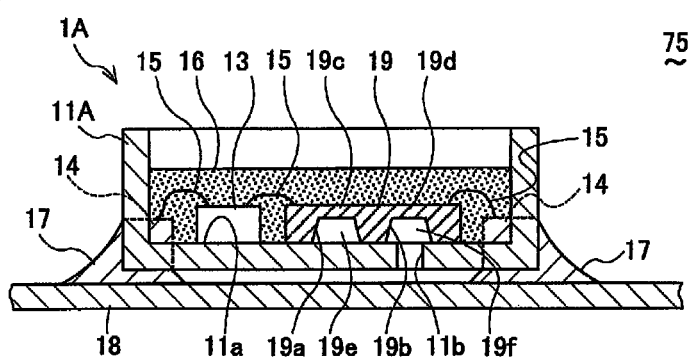
FIG. 7 is a diagram illustrating a cross-sectional view of a pressure sensor according to a second embodiment of the present disclosure.

A pressure sensor 1A according to a second embodiment of the present embodiment is described below with reference to FIG. 7. The pressure sensor 1A differs from the pressure sensor 1 of the first embodiment as follows.

In the pressure sensor 1A, a sensor body 19 is mounted on a bottom 11a of a sensor housing 11A. The sensor body 19 corresponds to a combination of a first detector and a second detector recited in claims. Like in the first embodiment, a lower surface of the sensor body 19 is provided with a first recess 19a and a second recess 19b. A first diaphragm 19c and a second diaphragm 19d are formed on bottoms (tops in FIG. 7) of the first recess 19a and the second recess 19b, respectively.

Thus, a first chamber 19e is formed between the sensor housing 11A and the first diaphragm 19c, and a second chamber 19f is formed between the sensor housing 11A and the second diaphragm 19d. As can be seen from FIG. 7, the first chamber 19e is isolated from the second chamber 19f and the sealed room 75.

Unlike in the first embodiment, the sensor body 19 does not have the extension portion 12g through which the second chamber 12f communicates with the sealed room 75. Instead, a through hole 11b is formed in the bottom 11a of the sensor housing 11A at a position corresponding to the second chamber 19f. The through hole 11b penetrates the sensor housing 11A so that the second chamber 19f can communicate with the sealed room 75.

As described above, according to the second embodiment, the through hole 11b through which the second chamber 19f communicates with the sealed room 75 is formed in the bottom 11a of the sensor housing 11A. In such an approach, there is no need that the sensor body 19 has the extension portion 12g extending upward to reach the sealed room 75 by penetrating the protector 16. Accordingly, a process of manufacturing the sensor body 19 and, by extension, the pressure sensor 1A can be simplified.

(Third Embodiment)

Figure 8:
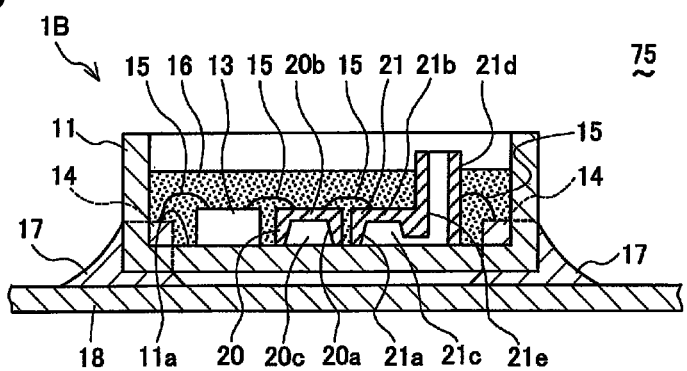
FIG. 8 is a diagram illustrating a cross-sectional view of a pressure sensor according to a third embodiment of the present disclosure.

A pressure sensor 1B according to a third embodiment of the present embodiment is described below with reference to FIG. 8. The pressure sensor 1B differs from the pressure sensor 1 of the first embodiment as follows.

In the pressure sensor 1B, a first sensor chip 20 and a second sensor chip 21 separated from the first sensor chip 20 are mounted on the bottom 11a of the sensor housing 11. The first sensor chip 20 and the second sensor chip 21 respectively correspond to a first detector and a second detector recited in claims.

A lower surface of the first sensor chip 20 is provided with a first recess 20a, and a lower surface of the second sensor chip 21 is provided with a second recess 21a. A first diaphragm 20b and a second diaphragm 21b are formed on bottoms (tops in FIG. 8) of the first recess 20a and the second recess 21a, respectively.

Thus, a first chamber 20c is formed between the sensor housing 11 and the first diaphragm 20b, and a second chamber 21c is formed between the sensor housing 11 and the second diaphragm 21b. As can be seen from FIG. 8, the first chamber 20c is isolated from the second chamber 21c and the sealed room 75. Further, the bonding wires 15 connect the electrodes 14 to the second sensor chip 21, connect the first sensor chip 20 to the second sensor chip 21, connect the first sensor chip 20 to the circuit chip 13, and connect the electrodes 14 to the circuit chip 13.

Like the sensor body 12 of the first embodiment, the second sensor chip 21 has an integral extension portion 21d extending (upward in FIG. 8) to reach the sealed room 75 by penetrating the protector 16. The extension portion 21d has a through hole 21e extending through it and communicating with the sealed room 75 and the second chamber 21c. Thus, the second chamber 21c communicates with the sealed room 75 via the through hole 21e.

(Fourth Embodiment)

Figure 9:
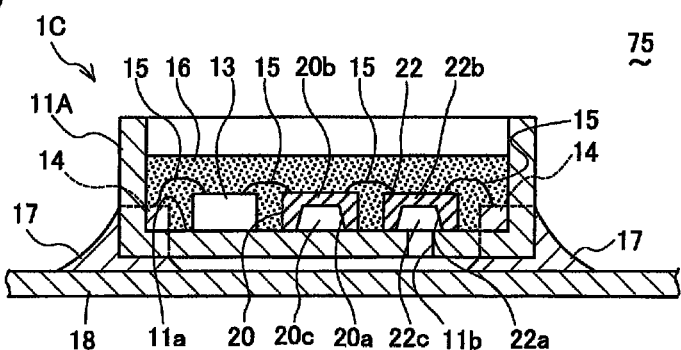
FIG. 9 is a diagram illustrating a cross-sectional view of a pressure sensor according to a fourth embodiment of the present disclosure.

A pressure sensor 1C according to a fourth embodiment of the present embodiment is described below with reference to FIG. 9. The pressure sensor 1C is similar to but differs from the pressure sensor 1B of the third embodiment as follows.

In the pressure sensor 1, a first sensor chip 20 and a second sensor chip 22 separated from the first sensor chip 20 are mounted on a bottom 11a of a sensor housing 11A. The first sensor chip 20 and the second sensor chip 22 respectively correspond to a first detector and a second detector recited in claims. The first sensor chip 20 is the same as the first sensor chip 20 of the third embodiment, but the second sensor chip 22 is different from the second sensor chip 21 of the third embodiment. The first sensor chip 20 and the second sensor chip 22 are substantially identical in structure.

A lower surface of the first sensor chip 20 is provided with a first recess 20a, and a lower surface of the second sensor chip 22 is provided with a second recess 22a. A first diaphragm 20*b* and a second diaphragm 22*b* are formed on bottoms (tops in FIG. 9) of the first recess 20*a* and the second recess 22*a*, respectively.

Thus, a first chamber 20*c* is formed between the sensor housing 11A and the first diaphragm 20*b*, and a second chamber 22*c* is formed between the sensor housing 11A and the second diaphragm 22*b*. As can be seen from FIG. 9, the first chamber 20*c* is isolated from the second chamber 22*c* and the sealed room 75. Further, the bonding wires 15 connect the electrodes 14 to the second sensor chip 22, connect the first sensor chip 20 to the second sensor chip 22, connect the first sensor chip 20 to the circuit chip 13, and connect the electrodes 14 to the circuit chip 13.

Unlike in the third embodiment, the second sensor chip 22 does not have the extension portion 21*d*. Instead, a through hole 11*b* is formed in the bottom 11*a* of the sensor housing 11A at a position corresponding to the second chamber 22*c*. The through hole 11*b* penetrates the sensor housing 11A so that the second chamber 22*c* can communicate with the sealed room 75.

As described above, according to the fourth embodiment, the same chip can be used for the first sensor chip 20 and the second sensor chip 22. Thus, the number of kinds of parts required to manufacture the pressure sensor 1C can be reduced.

(Fifth Embodiment)

Figure 10:
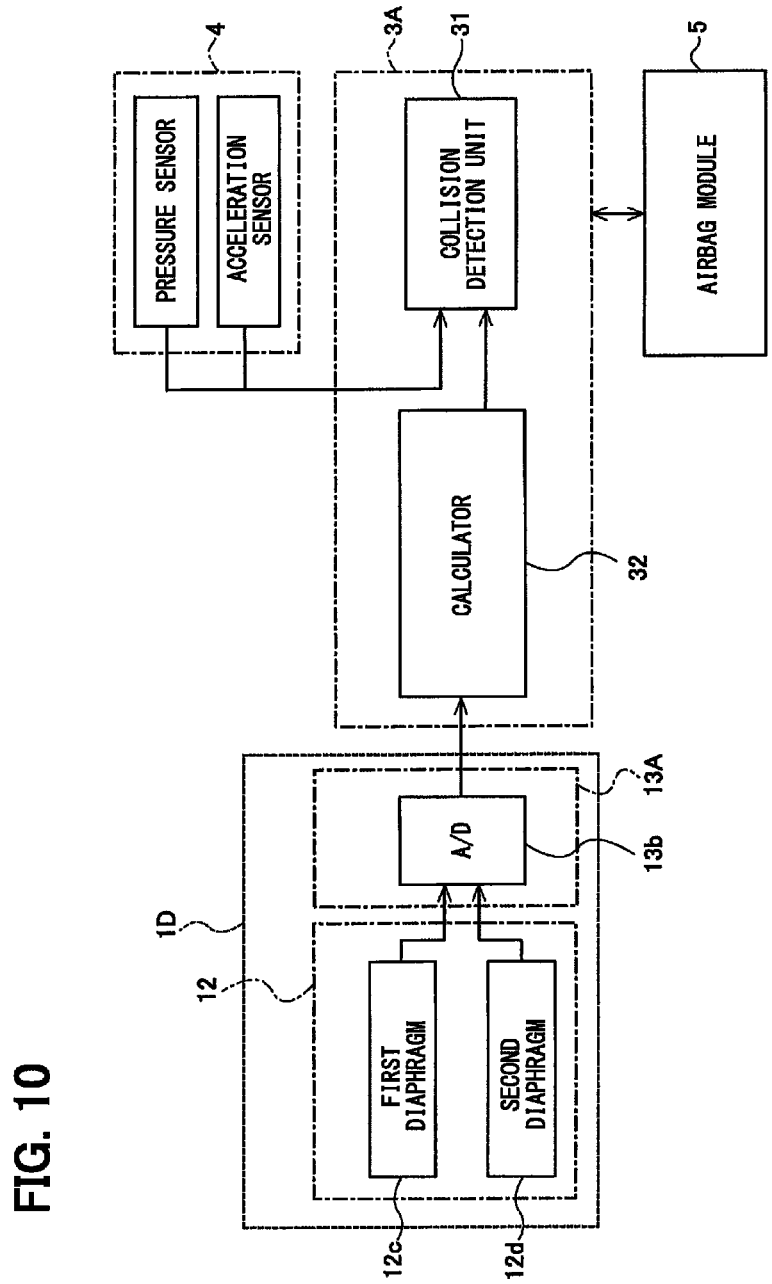
FIG. 10 is a block diagram of an airbag system including a pressure sensor according to a fifth embodiment of the present disclosure.

An airbag system including a pressure sensor 10 according to a fifth embodiment of the present embodiment is described below with reference to FIG. 10. The pressure sensor 1D is similar to but differs from the pressure sensor 1 of the first embodiment as follows.

The pressure sensor 1D includes a circuit chip 13A connected to the sensor body 12. Like the circuit chip 13 of the pressure sensor 1 of the first embodiment, the circuit chip 13A has the A/D converter 13*b*. However, unlike the circuit chip 13, the circuit chip 13A does not have the calculator 13*a*. Instead, an airbag controller 3A has a calculator 32 having the same calculation function as the calculator 13*a*. The calculator 32 is connected to the A/D converter 13*b* and the collision detection unit 31 of the airbag controller 3A.

The detection value PS1 of the first diaphragm 12*c* and the detection value PS2 of the second diaphragm 12*d* are digitalized by the A/D converter 13*b* and then sent to the airbag controller 3A. In the airbag controller 3A, the calculator 32 calculates the pressure PS0 in the sealed room 75 by subtracting the detection value PS2 from the detection value PS1.

As described above, according to the fifth embodiment, the calculator 13*a* is not included in the circuit chip 13A. Accordingly, the circuit chip 13A and, by extension, the pressure sensor 1D can be reduced in size.

(Modifications)

While the present disclosure has been described with reference to the embodiments, it is to be understood that the disclosure is not limited to the embodiments. The present disclosure is intended to cover various modifications and equivalent arrangements within the spirit and scope of the present disclosure. For example, the embodiments can be modified as follows.

The pressure sensor according to the present disclosure can be used to detect a collision to a door different from the side door of the vehicle. For example, the pressure sensor can be used to detect a collision to a back door of the vehicle.

The pressure sensor can be used for other applications than the vehicle collision detection.

In the embodiments, the pressure sensor is configured so that when the impact vibration applied to the first diaphragm 12*c* has the same magnitude and direction as the impact vibration applied to the second diaphragm 12*d*, the detection value of the first diaphragm 12*c* can be equal to the detection value of the second diaphragm 12*d*. It is not always essential that when the impact vibration applied to the first diaphragm 12*c* has the same magnitude and direction as the impact vibration applied to the second diaphragm 12*d*, the detection value of the first diaphragm 12*c* can be equal to the detection value of the second diaphragm 12*d*. That is, when the impact vibration applied to the first diaphragm 12*c* has the same magnitude and direction as the impact vibration applied to the second diaphragm 12*d*, the detection value of the first diaphragm 12*c* can be different from the detection value of the second diaphragm 12*d* by a certain value which allows the subtraction of the detection value of the second diaphragm 12*d* from the detection value of the first diaphragm 12*c* to remove the influence of the impact vibration on the detection value of the first diaphragm 12*c*.

Such changes and modifications are to be understood as being within the scope of the present invention as defined by the appended claims.

What is claimed is:

1. A pressure sensor for a vehicle, the pressure sensor comprising:
    a sensor housing adapted to be mounted on the vehicle;
    a first detector located in the sensor housing and having a first diaphragm facing a sealed space of the vehicle;
    a second detector located in the sensor housing and having a second diaphragm facing the sealed space, and
    a protector located in the sensor housing and covering the first detector and the second detector, wherein
    a first chamber is formed between the first diaphragm and the sensor housing and isolated from the sealed space so that the first diaphragm is capable of being deformed by a pressure in the sealed space,
    a second chamber is formed between the second diaphragm and the sensor housing and communicates with the sealed space,
    the first diaphragm and the second diaphragm are continuously covered with the same protector, and produce the same signal when being deformed by the same amount in the same direction,
    the second detector includes an extension portion that penetrates through the protector to reach the sealed space, and
    the extension portion defines therein a through hole via which the second chamber communicates with the sealed space.

2. The pressure sensor according to claim 1, wherein the first detector and the second detector are integrated as a single detector.

3. The pressure sensor according to claim 1, further comprising:
    a calculator configured to subtract a detection value of the second detector from a detection value of the first detector.

4. The pressure sensor according to claim 1, wherein the sealed space is formed inside a door of the vehicle, and the pressure sensor detects an increase in the pressure in the sealed space caused when the sealed space is compressed in the event of a collision to the door.

5. The pressure sensor according to claim 1, wherein the protector is absent in the through hole, the first chamber and the second chamber.

6. The pressure sensor according to claim 1, wherein the first chamber is isolated from the second chamber.

7. The pressure sensor according to claim 1, wherein the first diaphragm is configured to deform when a pressure change occurs in the sealed space and the second diaphragm is configured to not deform when a pressure change occurs in the sealed space.

8. The pressure sensor according to claim 1, wherein a first thickness of the protector covering the first diaphragm is the same as a second thickness of the protector covering the second diaphragm.

9. The pressure sensor according to claim 1, wherein the first diaphragm and the second diaphragm are integral with each other.

* * * * *